United States Patent [19]

Iwata et al.

[11] Patent Number: 4,495,343

[45] Date of Patent: Jan. 22, 1985

[54] VISIBLE LIGHT-SENSITIVE POLYESTER POLYMER AND VISIBLE LIGHT-SENSITIVE RESIN COMPOSITION CONTAINING SAID POLYMER

[75] Inventors: Kaoru Iwata, Hachioji; Tsuneo Hagiwara; Hiroshi Matsuzawa, both of Hino, all of Japan

[73] Assignee: Teijin Limited, Osaka, Japan

[21] Appl. No.: 501,395

[22] Filed: Jun. 6, 1983

[30] Foreign Application Priority Data

Feb. 23, 1983 [JP] Japan .................................. 58-27716

[51] Int. Cl.$^3$ ..................... C08G 69/08; C08G 69/44
[52] U.S. Cl. .................................. 528/292; 430/286; 430/300
[58] Field of Search ........................................ 528/292

[56] References Cited

U.S. PATENT DOCUMENTS

| | | | |
|---|---|---|---|
| 4,092,162 | 5/1978 | Wright et al. | 528/292 X |
| 4,331,751 | 5/1982 | Isaacson et al. | 528/292 X |
| 4,340,718 | 7/1982 | Zannucci et al. | 528/292 X |
| 4,412,059 | 10/1983 | Krigbaum et al. | 528/292 X |

*Primary Examiner*—Lucille M. Phynes
*Attorney, Agent, or Firm*—Wenderoth, Lind & Ponack

[57] ABSTRACT

A photocrosslinkable substantially linear polyester polymer having sensitivity to visible light is provided which contains at least 10 mole %, based on the entire polymer, of units derived from a phenylenebis($\alpha$-cyanobutadienecarboxylic acid) and has a reduced viscosity of at least 0.2 dl/g. A typical use of the polymer is in making printing plates.

13 Claims, No Drawings

VISIBLE LIGHT-SENSITIVE POLYESTER POLYMER AND VISIBLE LIGHT-SENSITIVE RESIN COMPOSITION CONTAINING SAID POLYMER

This invention relates to a novel photocrosslinkable polymer having sensitivity to visible light, and a visible light-sensitive resin composition containing the aforesaid polymer. More specifically, this invention relates to a visible light-sensitive polyester polymer containing a phenylenebis($\alpha$-cyanobutadienecarboxylic acid) as at least a part of its acid component, and a visible light-sensitive resin composition containing it.

Heretofore, polymers having groups derived, for example, from cinnamic acid esters, cinnamylideneacetic acid esters, chalcone, benzylideneacetone, coumarine, etc. in the side chains have been known as photosensitive resins of the type which is insolubilized by photocrosslinking reaction (photodimerization reaction) under ultraviolet light [see, for example, H. W. Watkinson, SPIE, 223, 68 (1980); H. W. Vollmann, Angew. Chem. Int. Ed. Engl. 19, 99 (1980); J. L. R. Williams et al.; Pure & Appl. Chem., 49 (4), 523 (1977); G. A. Delzenne, Adv. Photochem., 11, 1, 1979; A. Reiser, P. L. Egerton, Photogr. Sci. Eng. 23, 144, 1979; and "Photopolymers" (CMC), 1977, edited by Takahiro Tsunoda]. Poly(vinyl cinnamate) has come into practical use as a resist resin or a resin for making printing plates such as an offset presensitized plate. On the other hand, polyesters containing phenylenediacrylic acid as an acid component have been known as photosensitive resins of the type having a photosensitive group in the main chain (see U.S. Pat. Nos. 3,775,112 and 3,622,320), and have been in practical use as photosensitive resins for lithographic printing plates having excellent abrasion resistance and good sensitization property.

In recent years, printing technology involving the use of laser light has been developed in the field of newspaper printing. Light sources which emit visible light of a relatively long wavelength, such as an argon laser or helium-neon laser, are mainly used as laser light sources for such plate making devices. With the argon laser, the light of its ultraviolet region can also be utilized. However, since the intensity of the ultraviolet region is much weaker than that of light in the visible region, it is preferred to utilize visible light rather than the ultraviolet light.

Most of the known photosensitive resins exemplified above are sensitive to ultraviolet light, but substantially insensitive to visible light. In order to use such ultraviolet light-sensitive resins in the field of laser plate making, it has been proposed to incorporate sensitizers capable of being excited by visible light into the ultraviolet light-sensitive resins [see H. Tanaka, Y, Sato, J. Polym. Sci., Polym. Chem. Ed., 10, 3279 (1972); H. Tanaka et al., J. Polym. Sci., A-1, 10, 1729 (1972); T. Yamaoka et al., Polymer, 18, 81 (1977); and K. Koseki et al., The 45th National Meeting of the Chemical Society of Japan (Tokyo, Apr. 2, 1982), page 1155]. Such photosensitive resins containing sensitizers are still not entirely satisfactory. For example, such sensitizers are very complex, or do not give sufficiently high sensitivity. Or the compatibility of such sensitizers with the photosensitive resins is poor. In a high intensity short time exposure as in a laser plate making process, a high intensity reciprocity law failure occurs to cause a marked decrease in sensitivity. It has therefore been strongly desired to develop a photosensitive resin which is highly sensitive to visible light.

The present inventors noted the phenomenon that as the number of conjugated double bonds of an unsaturated carboxylic acid ester is increased, the light absorption spectrum of the carboxylic acid markedly shifts to a longer wavelength side. In order to apply this phenomenon to photosensitive polymers sensitive to visible light, the present inventors have made extensive investigations and have now found that a polyester containing a phenylenebis($\alpha$-cyanobutadienecarboxylic acid) is highly sensitive to visible light, for example light in the visible region of argon laser without adding a sensitizer to the polymer.

Thus, according to this invention, there is provided a substantially linear polyester polymer having sensitivity to visible light, said polymer containing at least 10 mole%, based on the entire polymer, of recurring units of the following formula

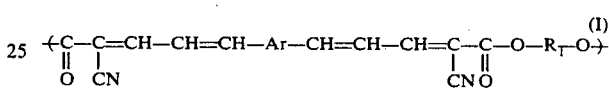

wherein Ar represents

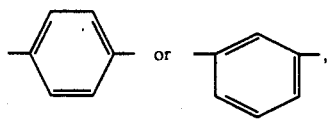

and $R_1$ represents a divalent aliphatic hydrocarbon group having not more than 20 carbon atoms, the chain of which may be interrupted by one or more oxygen atoms, and having a reduced viscosity (as defined hereinbelow) of at least 0.2 dl/g.

As can be seen from formula (I), the novel polymer provided by this invention is a polyester polymer containing a phenylenebis($\alpha$-cyanobutadienecarboxylic acid) as at least a part of its acid component. The polyester polymer of the invention contains the recurring units of formula (I) in a proportion of at least 10 mole %, preferably at least 20 mole %, more preferably at least 30 mole %, based on the entire polymer. Thus, it may be composed solely of the recurring units of formula (I) [namely, the proportion of the recurring units of formula (I) is 100 mole %].

The polymer provided by this invention may contain only one kind of, or two or more kinds of, the recurring units of formula (I).

The phenylene group (Ar) in the phenylenebis($\alpha$-cyanobutadienecarboxylic acid) portion in formula (I) may be p-phenylene

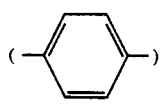

or m-phenylene

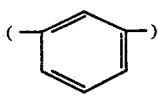

as indicated above. The p-phenylene group is suitable for the object of this invention because it generally is more liable to be conjugated with the double bonds of butadiene and a polymer containing the recurring units of formula (I) in which Ar is a p-phenylene group tends to have increased sensitivity to light of long wavelengths. On the other hand, a polymer containing the recurring units of formula (I) in which Ar is a m-phenylene group has low crystallinity and increased solubility. Hence, depending upon the desired end use, it is convenient to select the polymer containing the recurring units of formula (I) in which Ar is a p-phenylene group, the polymer containing the recurring units of formula (I) in which Ar is a m-phenylene group, a polymer containing both of these units, or a mixture of such polymers properly.

In formula (I), the group $R_1$ is a moiety derived from a polyol component of the polyester polymer and denotes a residue resulting from removing two OH groups from a diol normally used in the production of polyester polymers. Specifically, it may be a divalent aliphatic hydrocarbon group containing not more than 20, preferably 2 to 12, more preferably 2 to 8, carbon atoms of which chain may optionally be interrupted by one or more oxygen atoms, preferably 1 to 5 oxygen atoms, more preferably 1 to 3 oxygen atoms. The aliphatic hydrocarbon group may generally be saturated, and may be linear, branched, cyclic, linear-cyclic, or branched-cyclic.

Typical examples of the aliphatic hydrocarbon group ($R_1$) include (a) groups of the formula $+CH_2CH_2O)_{m-1}CH_2CH_2-$ in which m is an integer of 2 to 4; (b) alkylene groups having 2 to 8 carbon atoms such as ethylene, propylene, butylene, 2-methylpropylene, pentamethylene, neopentylene, hexamethylene, heptamethylene and octamethylene; (c) cycloalkylene groups having 3 to 7 carbon atoms such as

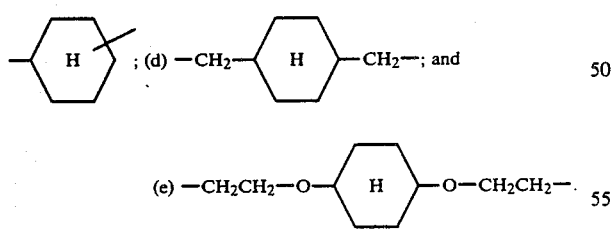

Of these, the groups (a) or (b),

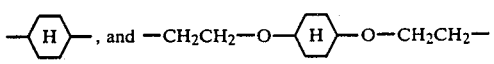

are preferred.

The polyester polymers provided by this invention may be composed only of the recurring units of formula (I), but may further include recurring units of the following formula

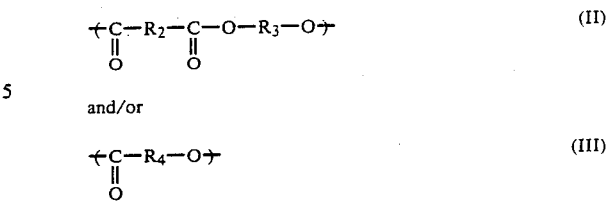

and/or wherein $R_2$ represents a divalent hydrocarbon group having not more than 15 carbon atoms, $R_3$ represents a divalent aliphatic hydrocarbon group having not more than 20 carbon atoms, the chain of which may be interrupted by one or more oxygen atoms, and $R_4$ represents a divalent hydrocarbon group having 4 to 9 carbon atoms.

In formula (II), $R_2$ is a moiety derived from the acid component of the polyester polymer and denotes a residue resulting from the removal of two COOH groups from a dicarboxylic acid normally used in the production of polyesters. Specifically, it may be a divalent hydrocarbon group having not more than 15 carbon atoms, preferably 1 to 10 carbon atoms, more preferably 1 to 8 carbon atoms. Such a hydrocarbon group may be saturated or unsaturated, and may be linear or branched aliphatic, alicyclic and aromatic, or a combination of any two of these. Typical examples of the hydrocarbon group ($R_2$) include (a) alkylene groups having 1 to 10 carbon atoms such as $-CH_2-$, $-CH_2CH_2-$, $+CH_2)_4$, $+CH_2)_5$, $+CH_2)_6$, $+CH_2)_7$, $+CH_2)_8$, $+CH_2)_9$, $+CH_2)_{10}$ and $-CH_2C(CH_3)_2CH_2-$; (b) cycloalkylene groups having 3 to 7 carbon atoms such as

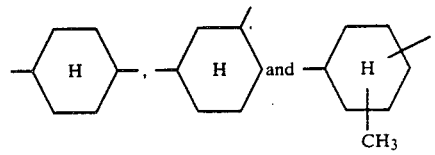

and (c) arylene groups such as p-phenylene, m-phenylene, naphthylene,

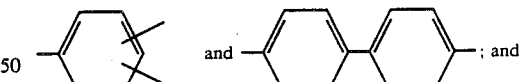

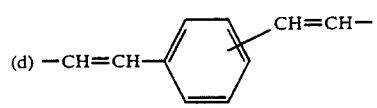

and $-CH=CH-$. Of these, the alkylene groups having 1 to 8 carbon atoms, $-CH=CH-$,

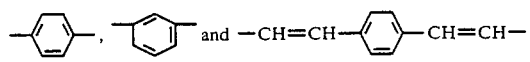

are preferred.

The group $R_3$ in formula (II) may have the same meaning as the group $R_1$ described with regard to formula (I), but need not to be the same group as $R_1$.

The units of formula (III) are a moiety derived from a hydroxycarboxylic acid. The group $R_4$ may specifically be a divalent hydrocarbon group having 4 to 9 carbon atoms, preferably 5 or 6 carbon atoms. Examples of suitable hydrocarbon groups for $R_4$ are alkylene groups such as $-(CH_2)_5-$, cycloalkylene groups such as

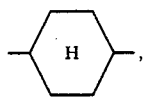

and arylene groups such as

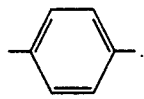

When the recurring units of formula (II) and/or (III) exist, their proportion may be at most 90 mole %, preferably not more than 80 mole %, more preferably not more than 70 mole %, based on the entire polymer.

The polyester polymer of the invention composed of the recurring units described above can be produced, for example, by melt-polymerizing phenylenebis(α-cyanobutadienecarboxylic acid) of the following formula or its reactive derivative

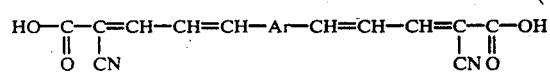
(VII)

wherein Ar is as defined hereinabove, or its reactive derivative with a diol of the following formula $$HO-R_1-OH \qquad (X)$$

wherein $R_1$ is as defined above, optionally together with a dicarboxylic acid and/or a hydroxy-carboxylic acid represented by the following formula

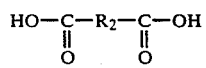
(VIII)

and/or

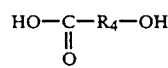
(IX)

wherein $R_2$ and $R_4$ are as defined above, or a reactive derivative thereof, in the presence of a catalyst.

Examples of the dicarboxylic acid of formula (VIII) include aromatic dicarboxylic acids such as terephthalic acid, isophthalic acid, naphthalenedicarboxylic acids, 4,4'-diphenyldicarboxylic acid, 2-methylterephthalic acid and 4-methylisophthalic acid; aliphatic dicarboxylic acids such as succinic acid, malonic acid, adipic acid, pimelic acid, suberic acid, azelaic acid, sebacic acid, maleic acid, fumaric acid, and muconic acid; alicylic dicarboxylic acids such as 1,3-cyclohexanedicarboxylic acid, 1,4-cyclohexanedicarboxylic acid, 2-methyl-1,4-cyclohexanedicarboxylic acid and 4-methyl-1,3-cyclohexanedicarboxylic acid; and p-phenylenediacrylic acid and m-phenylenediacrylic acid.

Ester derivatives are especially suitable as the reactive derivatives of the dicarboxylic acids of formulae (VII) and (VIII). There can be used a variety of aliphatic and alicyclic groups as ester residues. Examples include methyl, ethyl, propyl, isopropyl, butyl, isobutyl, amyl, isoamyl, 2-ethylhexyl and cyclohexyl groups. The type of the ester derivatives to be used is properly selected by considering the melting point of the intended ester derivative and the polymerization temperature.

Examples of the hydroxycarboxylic acid of formula (IX) are ε-hydroxycaproic acid 3- or 4-hydroxycyclohexanecarboxylic acid. The derivative of the hydroxycarboxylic acid (IX) may be an ester of the same type as exemplified above, or it may be used also in the form of ε-caprolactone.

Examples of the diol of formula (X) used as a diol component in the production of the polyester polymer of this invention (this diol may also be represented by the formula $HO-R_3-OH$ in which $R_3$ is as defined above) include aliphatic alkylene diols such as ethylene glycol, propylene glycol, tetramethylene glycol, pentamethylene glycol, heptamethylene glycol, neopentylene glycol, 1,3-cyclohexanedimethanol and 1,4-cyclohexanedimethanol; and alicyclic diols such as 1,3-cyclohexanediol, 1,4-cyclohexanediol and 2,2-bis(4-hydroxycyclohexyl)propane. From the viewpoint of reactivity, primary diols are advantageous and preferred. Another type of diols which can be conveniently used includes glycols containing an ether linkage, such as diethylene glycol, triethylene glycol, tetraethylene glycol, 1,4-di(β-hydroxyethoxy)cyclohexane, an ethylene oxide adduct of neopentylene glycol, and an ethylene oxide adduct of 2,2-bis(4-hydroxycyclohexyl)propane. These diols containing an ether linkage are preferred because they are effective for increasing the solubiliry of the resulting polymer. Such diols may also be used singly or in combination.

The dicarboxylic acid component, hydroxycarboxylic acid component and diol component described above can be used in molar proportions which correspond to the mole percents of the recurring units of formulae (I), (II) and (III) desired in the polyester polymer obtained. Thus, the dicarboxylic acid of formula (VII) or its reactive derivative can be used in a proportion of at least 10 mole %, preferably at least 20 mole %, more preferably at least 30 mole %, based on the total acid component (the total amount of the dicarboxylic acid and the hydroxycarboxylic acid) used.

The polyester polymer of this invention can be produced from the dicarboxylic acid component, the hydroxycarboxylic acid component and the diol component by, for example, a melt-polymerization method in the presence of a catalyst. Advantageously, it can be produced by polymerizing the aforesaid dicarboxylic acid and diol components (optionally together with the hydroxycarboxylic acid) at an elevated temperature of 150° to 250° C. in the absence of a solvent.

According to a preferred embodiment of producing the polyester polymer of this invention, an equimolar or larger proportion of the diol is added to the dicarboxylic acid and/or its ester derivative having higher reactivity, and as desired, a required amount of the hydroxycarboxylic acid is added. The mixture is heated optionally in the presence of a polymerization catalyst and a radical polymerization inhibitor and under reduced pressure. As the reaction proceeds, water and/or alcohol formed as by-products and the unreacted diol are distilled off out of the reaction system. The diol may be used in an equimolar or larger proportion as described above. In order to obtain a polymer of a high degree of polymerization, it is preferably used in an excessive molar proportion and the excess is distilled out of the reaction system as the polymerization proceeds. Generally, the diol is used in an amount of 1 to 10 moles, preferably 1.1 to 8 moles, per mole of the dicarboxylic acid component. If the amount of the diol is less than 1 mole, it is generally difficult to obtain a polymer of a high degree of polymerization. Even if the diol is used in an amount exceeding 10 moles, no corresponding advantage is obtained, and further addition is insignificant.

Preferably, the reaction is carried out in the presence of a catalyst. Catalysts normally used in the production of polyesters can be equally used in this invention. Examples include Li, Na, K, Ca, Mg, Mn, Zn, Fe, Co, Ti, Sb, Sn, Pb, Ge and B, the oxides, hydroxides and alcoholates of these metals, salts of these metals with inorganic or organic acids, and double salts or complex salts of these metals.

To prevent undesirable gellation caused by radical reaction by heat, a radical polymerization inhibitor may preferably be used. Examples of the inhibitors include quinones such as p-benzoquinone, naphthoquinone and 2,5-diphenyl-p-benzoquinone; hydroquinones such as hydroquinone, 2,5-di-t-butylhydroquinone and t-butylhydroquinone; phenols such as ditertiary butyl-p-cresol and hydroquinone monomethyl ether; and organic or inorganic copper salts such as copper naphthenate.

The reaction is carried out at a temperature in the range of 150° to 250° C., preferably 170° to 230° C. At higher reaction temperatures, undesirable crosslinking and gellation tends to take place owing to radical reaction. The polymerization reaction is carried out generally under atmospheric pressure in the early stage and under reduced pressure in the later stage of the reaction. Conveniently, in the final stage, the pressure is not more than 1 mmHg, preferably not more than 0.8 mmHg.

The structure of the resulting polymer can be determined by, for example, elemental analysis, infrared absorption spectrometry, nuclear magnetic resonance spectrometry, visible ultraviolet absorption spectrometry, etc. The degree of polymerization of the polymer can be measured by a viscosity measuring method, a terminal group determining method, a VPO method or an osmotic pressure method.

The polyester polymer of this invention produced as above is substantially linear. The term "substantially linear" means that the polymer is soluble in a mixture of phenol and tetrachloroethane (in a weight ratio of 40:60). Generally, the sensitivity of the polyester polymer to visible light depends upon its molecular weight, and is higher as the molecular weight is higher. The polyester polymer of this invention has a reduced viscosity of at least 0.2 dl/g, preferably at least 0.3 dl/g. The term "reduced viscosity", as used in the present specification and the appended claims, denotes a value measured at 30° C. in a mixed solvent of phenol and tetrachloroethane in a weight ratio of 40:60.

The polyester polymer provided by this invention is sensitive to visible light containing light rays having a wavelength of about 485 nm and/or about 515 nm, and is widely used in the field of information electronics, printing, and enlarged plate making through microfilms as resists or laser-sensitive resins for direct plate making.

For example, when Ar in the recurring units of formula (I) is a p-phenylene group, the polymer is sensitive to light in a wavelength region of 270 to 590 nm and has photosensitive peaks around 488 and 515 nm, the wavelengths of the light emitted by an argon laser. Hence, this polymer can directly be used especially as a photosensitive material sensitive to argon laser. Since it has a broad range of photosensitivity, it can be used with light sources having a wide wavelength distribution. It is also useful as a plate making material for enlarged plate making using a negative film.

The polymer in which Ar in the recurring units of formula (I) is a m-phenylene group is sensitive to light having a wavelength of 390 to 510 nm and has a photosensitive peak near 450 nm. This peak is close to the wavelength (442) of the light emitted by helium-cadmium laser. Accordingly, this polymer is suitable as a material sensitive to the light of helium-cadmium laser. When this polymer is used in combination with a photosensitizer such as a thiapyrylium salt, its range of photosensitive wavelengths can be further broadened to an argon laser-sensitive region.

When the polyester polymer of the invention is to be used in the aforesaid applications, the polymer is generally dissolved in a suitable solvent together with a resin binder and a sensitizer as optional components to prepare a visible light-sensitive resin composition. The photosensitive resin composition so prepared is coated on the surface of a substrate, dried and exposed imagewise to actinic light such as argon laser, helium-cadmium laser, helium-neon laser, a xenon lamp, a halogen lamp, a metal halide lamp, etc. The unexposed part is then removed by a solvent to give a photoresist such as a printed circuit board or a recording medium such as a lith film or an offset printing plate.

The resin binder is used to make the image clearer or improve the properties of the coated film. Examples of useful resin binders include polyester resins, polycarbonate resins, phenoxy resins, soluble nylon resins, acrylic resins, (meth)acrylonitrile resins, styrene resins, acrylonitrile-styrene resins (AS resin), acrylonitrile-butadiene-styrene resin (ABS resin), ethylene/vinyl acetate resin, vinyl chloride resins, vinylidene chloride resins, butyral resins, vinyl acetate resins and cellulose resins. These resins are soluble in solvents and are compatible with the polyester polymer of the invention. Of these binders, the polyester resins and polycarbonate resins are preferred. These resin binders may be used singly or in combination. The amount of the resin binder is not critical. Generally, its amount is 0.05 to 5 times, preferably 0.1 to 3 times, the weight of the photosensitive polyester polymer.

Examples of the sensitizer as an optional component are erythrosine, Eosine, Rose Bengale, Benzanthracene, Michler's ketone, thio-Michler's ketone, pyrylium salts, thiapyrylium salts, 5-nitroacenaphthene, 9,10-phenanthroquinone, and Fluoresceine. These sensitizers may be used singly or in combination. The amount of the sensitizer used is 0.1 to 20% by weight, preferably 0.5 to 10% by weight, based on the weight of the polyester polymer.

Any solvents which can dissolve the photosensitive resin composition and be dried may be used in this invention. Examples include ketones such as acetone, methyl ethyl ketone, methyl isobutyl ketone and cyclohexanone; halogenated hydrocarbons such as methylene chloride, chloroform, dichloroethane, trichloroethylene and trichloroethane; ethers such as ethyl ether, propyl ether, tetrahydrofuran, dioxane, monoglyme and diglyme; esters such as ethyl acetate, butyl acetate, amyl acetate and Cellosolve acetate; hydrocarbons such as hexane, heptane, cyclohexane, benzene, toluene and xylene; aprotic polar solvents such as dimethylformamide, dimethylacetamide, N-methylpyrrolidone and dimethyl sulfoxide. These solvents may be used singly or in combination.

In order to secure storage stability and prevent so-called fog by heat polymerization, a heat polymerization inhibitor may be included in the photosensitive resin composition of this invention. Examples of such an inhibitor are hydroquinone, hydroquinone monomethyl ether, catechol, 2,6-di-tert-butylphenol, benzoquinone, N-nitrosodiphenylamine, sodium p-nitrophenylacetate and phenothiazine. The amount of the inhibitor to be used is 1 to 10,000 ppm, preferably 10 to 5,000 ppm, based on the polyester polymer.

To make the image more vivid, it is possible, as required, to add carbon black or various dyes or pigments to the resin composition.

The photosensitive resin composition of this invention may be applied to such substrates as plastic films, plastic sheets, various metal plates (e.g., an aluminum plate), etc.

The photosensitive resin of this invention can be photocrosslinked and cured by visible light as stated hereinabove. It may also be photocrosslinked and cured by ultraviolet light. Light sources which can generate actinic light usually include a carbon arc lamp, an ultra-high pressure mercury lamp, a high pressure mercury lamp, a low pressure mercury lamp, a xenon lamp, a chemical lamp, a halogen lamp, a metal halide lamp, and various lasers such as helium-neon laser, argon laser, helium-cadmium laser and crypton laser. The photosensitive resin composition of this invention is especially effective for lasers which have a main wavelength in the range of about 400 to about 500 nm and are used as principal light sources for laser printing, such as an argon laser or helium-cadmium laser.

It has further been found in accordance with this invention that the sensitivity of the photosensitive resin composition becomes higher when the polyester polymer of the invention is used in combination with a substantially linear polymer (to be referred to as a "pendant-type polymer") which has a group of the following formula

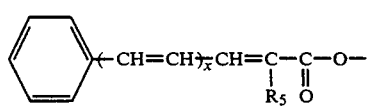
(IV)

wherein $R_5$ represents a hydrogen atom or CN and x is 0 or 1, as a pendant side-chain and is substantially insensitive to visible light having a long wavelength and compatible with the polyester polymer.

The pendant-type polymer alone is substantially insensitive to visible light having a wavelength of at least 450 nm as shown in the above-cited papers of H. Tanaka et al. and T. Yamaoka et al. and does not undergo an effective photocrosslinking reaction upon the irradiation of visible light such as argon laser. When blended with the polyester polymer of this invention, this pendant-type polymer does not function merely as a binder. But the two polymers interact to markedly strengthen the light sensitivity of the polyester polymer to visible light. The polyester polymer alone undergoes a sufficient photocrosslinking reaction, but in the presence of the pendant-type polymer, the insolubilization of the polymer of this invention by photocrosslinking reaction is markedly accelerated.

In the present specification and the appended claims, the term "substantially insensitive to visible light" means that in the evaluation of sensitivity according to the development method B described hereinafter, the absolute sensitivity is at least $10^3$ mJ/cm$^2$ when the polymer is photocrosslinked by irradiation of argon laser having wavelengths of 488 nm and 515 nm. In other words, crosslinking reaction does not take place to a practical degree unless there is irradiation of an energy of at least $10^3$ mJ/cm$^2$.

In the group of formula (IV) above, $R_5$ is a hydrogen atom or —CN, and x is 0 or 1. $R_5$ is preferably —CN rather than a hydrogen atom and x is preferably 1 rather than 0 because in such a case the spectral sensitivity extends to a longer wavelength side. Accordingly, a group of formula (IV) in which $R_5$ is —CN and x is 1, i.e. an α-cyanocinnamylideneacetoxy group, is most preferred.

Advantageously, the pendant-type polymer having the group of formula (IV) can be produced by reacting a substantially linear polymer having a hydroxyl group in the side chain with a carboxylic acid of the following formula

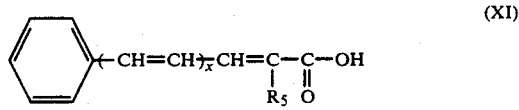
(XI)

wherein $R_5$ and x are as defined above, or its reactive derivative, thereby introducing the group of formula (IV) into the polymer through an ester linkage.

Examples of the polymer having a hydroxyl group in the side chain include polymers having recurring units of the following formula

(XII)

or

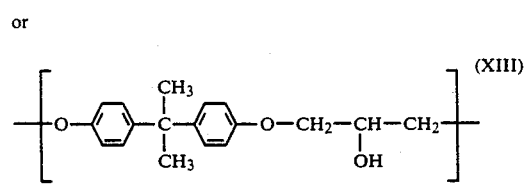
(XIII)

wherein $R_6$ represents a hydrogen atom or a methyl group, and $R_7$ represents a direct bond,

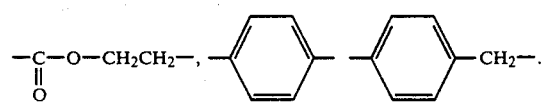

Desirably, the proportion of the above recurring units is at least 50 mole %, preferably at least 60 mole %, more preferably at least 70 mole %, based on the entire polymer.

Such a hydroxyl-containing polymer is esterified with the carboxylic acid of formula (XI) or its reactive derivative to form the pendant-type polymer. The esterification can be carried out until at least 50%, preferably at least 60%, more preferably at least 70%, of the hydroxyl groups present in the side chain of the hydroxyl-containing polymer is esterified.

As a result, there can be obtained a pendant-type polymer having recurring units of the formula

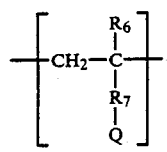 (V)

or

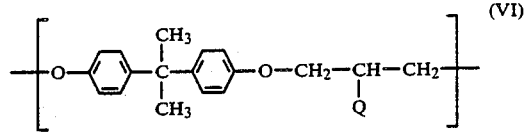 (VI)

wherein Q represents the group of formula (IV), and $R_6$ and $R_7$ are as defined above. The pendant-type polymer obtained may contain at least 25 mole %, preferably at least 50 mole %, preferably at least 70 mole %, of the units (V) or (VI) based on the entire polymer.

Specific examples of such a pendant-type polymer are the esters of the hydroxyl-containing polymer, such as polyvinyl alcohol, phenoxy resin, poly(hydroxyethyl acrylate), poly(hydroxyethyl methacrylate), poly(p-hydroxystyrene), and poly(p-hydroxymethylstyrene), with the carboxylic acids of formula (XI) or their reactive derivatives. When the availability of raw materials is taken into consideration, ester derivatives of polyvinyl alcohol containing at least 25 mole %, based on the entire polymer, of recurring units of the formula

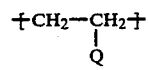

wherein Q is as defined above, and ester derivatives of bisphenol A-type phenoxy resin containing at least 25 mole %, based on the entire polymer, of recurring units of the formula

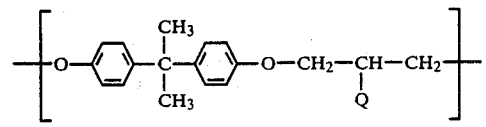

wherein Q is as defined, are especially preferred.

Those pendant-type polymers which have compatibility with the polyester polymer are selected.

In the present specification and the appended claims, the term "compatible" or "compatibility" used with regard to the resin binders and the pendant-type resins means that when the photosensitive resin composition of the invention is coated on a substrate such as an aluminum plate, a substantially uniform coated film is formed.

The effect of the pendant-type polymer having the group of formula (IV) to strengthen the light sensitivity of the polyester polymer of the invention is observed over a broad range of the blending proportion of the pendant-type polymer. When the pendant-type polymer is blended in a small amount with the polyester polymer or the polyester polymer is blended in a small amount with the pendant-type polymer, the sensitivity of the polyester polymer to visible light can be markedly increased. The polyester polymer and the pendant-type polymer can be blended in a weight ratio of generally from 95:5 to 5:95, preferably from 90:10 to 10:90, more preferably from 85:15 to 15:85.

The visible light-sensitive resin composition containing the pendant-type polymer containing the group of formula (IV) has higher sensitivity to visible light, especially to argon laser, than the photosensitive resin composition not containing the pendant-type polymer, as is demonstrated by Examples given hereinafter. Such a visible light-sensitive resin composition gives printing plates such as lithographic plates having images of good quality, and can be stored with excellent storage stability in the unexposed state.

The following examples illustrate the present invention more specifically.

All parts in these examples are by weight.

The reduced viscosity is a value measured at 30° C. in a mixed solvent composed of phenol and tetrachloroethane in a weight ratio of 40:60, unless otherwise specified.

The sensitivity was determined by the following developing methods.

Developing method A

A printing plate which has been imagewise exposed is put in a bath of methylene chloride, and while the plate is shaken, the unexposed part is gently dissolved. Then, the plate is rinsed in a fresh supply of methylene chloride and dried.

Developing method B

A printing plate which has been imagewise exposed is dipped for 1 minute in a developing solution having the following formulation, and then in this developing solution, lightly rubbed with a gauze about 40 times to remove the unexposed part. Then, the plate is rinsed in water and dried.

| Formulation of the developing solution | |
|---|---|
| Dichloromethane | 600 cc |
| 4-Butyrolactone | 1,000 cc |
| Glycerol | 100 cc |
| Methyl abiate | 10 cc |
| Hydrogenated wood resin | 1 cc |
| Lubricant (Zonyl A, a product of E. I. du Pont de Nemours & Co.) | 10.2 cc |
| Distilled water | 100 cc |
| 85% Phosphoric acid | 25 cc |

Developing method C

This method is the same as the developing method A except that a mixed solvent composed of phenol and tetrachloroethane in a weight ratio of 40:60 is used instead of methylene chloride used in the developing method A.

EXAMPLE 1

A reactor equipped with a stirrer was charged with 43.2 parts of p-phenylenebis(n-butyl α-cyanobutadienecarboxylate), 30.0 parts of triethylene glycol, 0.034 part of tetrabutyl titanate and 0.20 part of hydroquinone. They were heated with stirring at 200° C. for 40 minutes under atmospheric pressure, then for 30 minutes under an absolute pressure of 300 mmHg, further for 30 minutes under a pressure of 20 mmHg and further for 55 minutes under a pressure of 0.10 mmHg. During the reaction, the excess of triethylene glycol and the by-product butanol were distilled off out of the reaction system. The resulting reddish violet photosensitive polyester resin had a reduced viscosity of 0.92 dl/g. The elemental analysis values of this polyester were C66.91%, H5.53% and N6.21% which showed good correspondence with the calculated values C66.35%, H5.10% and N6.45%. Its infrared absorption spectrum (KBr tablet method) showed characteristic absorptions based on CN and the ester linkage at 2220 cm$^{-1}$ and 1718 cm$^{-1}$ respectively. Its nuclear magnetic resonance spectrum measured in CDCl$_3$ showed an absorption of proton based on

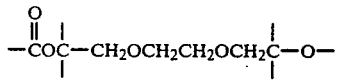

between δ3.78 ppm and 3.85 ppm; an absorption of proton based on

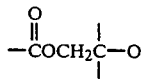

at δ4.5 ppm; an aromatic ring proton of p-phenylene at δ7.68 ppm; and an absorption based on the proton of

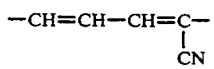

at δ7–8.2 ppm. Its ultraviolet visible absorption spectrum measured in chloroform showed a strong absorption at 290 to 470 nm ($\lambda_{max}$=405 nm).

Fifty parts of a polyester resin derived from an acid component composed of isophthalic acid and terephthalic acid (mole ratio 1:1) and a diol component composed of ethylene glycol and neopentyl glycol (mole ratio 1:1) and having a reduced viscosity of 0.69 dl/g (to be abbreviated polyester resin P) and 50 parts of the polyester obtained as above were dissolved in 1,000 parts of methylene chloride to prepare a dope. The dope was coated on a grained aluminum plate by means of a bar coater (No. 20), and dried at 60° C. for 10 minutes to prepare a lithographic printing plate. The plate was exposed for 60 seconds to light from a 460 W metal halide lamp (light having a wavelength of less than 430 nm was cut off by a filter) through a Kodak photostep tablet, and then developed with methylene chloride by the developing method (A). The number of steps, referred to as steps (A), of the image at this time was 18 (A). When the exposure time was 30 seconds, the number of steps (A) was 15, and when the exposure time was 10 seconds, the number of steps (A) was 13. The plate showed high sensitivity without adding a sensitizer.

The coated aluminum plate was exposed for 30 minutes to light from a 500 W xenon arc lamp using a spectral irradiating apparatus (a spectrometer RM-23(I)-64 manufactured by Narumi Shokai Co., Ltd.) in order to determine wavelengths to which the plate would be sensitive. It was found that the coated plate was sensitive to light having a wavelength of 270 to 590 nm.

In order to examine the sensitivity of the polymer, the lithographic printing plate was exposed to an argon laser light (power 0.1 W, beam diameter 1.25 mm) for ½ to 1/500 second, and then developed with methylene chloride. The required energy was determined from the time which elapsed until the resulting spot diameter reached 1.25 mm. It was defined as the absolute sensitivity (A). As a result, the absolute sensitivity (A) was as high as 1.0 mJ/cm$^2$.

This lithographic printing plate was subjected to high-intensity short-time exposure by an argon laser light (0.1 W) while controlling the exposure time per diameter of the laser beam to 0.6 microsecond by scanning the plate with the argon laser light at high speed. There was obtained a clear image. Its sensitivity was determined to be 1.5 mJ/cm$^2$ which was much the same as the absolute sensitivity. The resulting printing plate was subjected to a printing test on an offset printing machine. Clear prints were obtained.

A negative film was placed on the unexposed plate-making material and then the plate-making material was exposed to light from a glow light flouorescent lamp and developed. The resulting printing plate was subjected to a printing test on an offset printing machine to obtain 100,000 prints. These prints were clear.

The unexposed lithographic plate making material was stored in a dark place at 80° C. for 1 week in the air to perform an acceleration test, and then its sensitivity was evaluated. It was found that the absolute sensitivity (A) was 1.5 mJ/cm$^2$ and there was no change in the quality of the image, thus showing good heat stability.

COMPARATIVE EXAMPLE 1

A polyester resin having a shorter conjugated system than the polyester prepared in Example 1 was prepared by the same method as in Example 1 except that 27.4 parts of diethyl p-phenylenebis-acrylate was used instead of 43.2 parts of the p-phenylenebis(n-butyl α-cyanobutadienecarboxylate) used in Example 1. The resulting polyester resin had a reduced viscosity of 0.89 dl/g. Its ultraviolet visible absorption spectrum in chloroform showed an absorption at 280 to 370 nm ($\lambda_{max}$=308 nm). The absorption region thus shifted to a shorter wavelength side by about 100 nm than the absorption region of the resin obtained in Example 1.

The resulting polyester was coated on an aluminum plate by the same method as in Example 1 to prepare a lithographic printing plate. It was exposed for 60 seconds through a Kodak photostep tablet. But its sensitivity was 0. By spectral irradiation, this plate was sensitive to light in a wavelength region of 270 to 370 nm, and was not sensitive to visible light.

COMPARATIVE EXAMPLE 2

A photosensitive plate was prepared by the same method as in Example 1 except that 50 parts of p-phenylenebis(n-butyl α-cyanobutadienecarboxylate)

was used instead of 50 parts by weight of the photosensitive polyester resin used in Example 1. The plate was exposed for 60 seconds through a photostep tablet, but In Table 1, the step tablet sensitivity and absolute sensitivity were evaluated by the developing method (C).

TABLE 1

| Example | Diol component Type | Parts | Time spent for heating at 0.1 mmHg (min.) | Reduced viscosity (dl/g) | Infrared absorption spectrum (KBr) | | Elemental analysis C (%) | H (%) | N (%) | Absolute sensitivity (C) mJ/cm² | Number of steps (C) |
|---|---|---|---|---|---|---|---|---|---|---|---|
| 4 | Diethylene glycol | 21.2 | 15 | 0.45 | νCN 2210 | Calcd. | 67.68 | 4.65 | 7.18 | 320 | 5 |
|   |   |   |   |   | νCO 1708 | Found | 67.95 | 4.76 | 7.01 |   |   |
| 5 | 1,4-Di(β-hydroxyethoxy)-cyclohexane | 22.4 | 120 | 0.25 | νCN 2225 | Calcd. | 68.84 | 5.78 | 5.73 | 300 | 5 |
|   |   |   |   |   | νCO 1720 | Found | 69.06 | 5.83 | 5.42 |   |   |
| 6 | Ethylene glycol | 31.0 | 30 | 0.38 | νCN 2220 | Calcd. | 69.36 | 4.07 | 8.09 | 430 | 3 |
|   |   |   |   |   | νCO 1710 | Found | 69.68 | 4.43 | 7.83 |   |   |
| 7 | Pentamethylene glycol | 20.8 | 25 | 0.37 | νCN 2220 | Calcd. | 71.12 | 5.19 | 7.21 | 130 | 7 |
|   |   |   |   |   | νCO 1705 | Found | 71.39 | 5.53 | 7.08 |   |   |
| 8 | Heptamethylene glycol | 19.8 | 50 | 0.43 | νCN 2220 | Calcd. | 72.10 | 5.81 | 6.73 | 135 | 7 |
|   |   |   |   |   | νCO 1705 | Found | 72.53 | 5.96 | 6.48 |   |   |
| 9 | Triethylene glycol 1,4-Cyclohexane dimethanol | 16.5 15.8 | 60 | 0.43 | νCN 2225 νCO 1720 | Calcd. Found | — | — | — | 105 | 8 | its sensitivity was zero.

EXAMPLE 2

A reactor equipped with a stirrer was charged with 43.2 parts of p-phenylene bis(n-butyl α-cyanobutadienecarboxylate), 16.5 parts of triethylene glycol, 0.034 part of tetrabutyl titanate and 0.45 part of 2,5-diphenylbenzoquinone, and then they were heated at 200° C. for 90 minutes under atmospheric pressure, then for 25 minutes under an absolute pressure of 20 mmHg, and further for 60 minutes under a pressure of 0.25 mmHg to obtain a photosensitive polyester resin. The resin had a reduced viscosity of 0.75 dl/g. Its infrared absorption spectrum corresponded totally with the photosensitive polyester resin obtained in Example 1. A lithographic printing plate prepared from the photosensitive polyester resin in the same way as in Example 1 had a sensitivity of 13 steps (A) upon exposure for 60 seconds. Its absolute sensitivity (A) determined by the method shown in Example 1 was 11 mJ/cm².

EXAMPLE 3

The same materials as used in Example 1 were polymerized except that instead of the reaction conditions used in Example 1, they were heated with stirring at 200° C. for 40 minutes under atmospheric pressure, then for 30 minutes under an absolute pressure of 300 mmHg, then for 30 minutes under 20 mmHg and further for 30 minutes under 0.25 mmHg. A photosensitive polyester resin having a reduced viscosity of 0.48 dl/g was obtained. Its infrared absorption spectrum corresponded totally with that of the photosensitive polyester resin obtained in Example 1. A lithographic printing plate prepared from the resulting photosensitive polyester resin by the same method as in Example 1 had a sensitivity of 8 steps (A) upon exposure for 60 seconds. It had an absolute sensitivity (A), determined by the method shown in Example 1, of 90 mJ/cm².

EXAMPLES 4 TO 9

In each run, a photosensitive polyester resin was prepared by carrying out the same polymerization as in Example 1 except that each of the diols shown in Table 1 was used instead of 30.0 parts of triethylene glycol used in Example 1. The results are shown in Table 1.

EXAMPLE 10

A reactor equipped with a stirrer was charged with 43.2 parts of m-phenylenebis(n-butyl α-cyanobutadienecarboxylate), 30.0 parts of triethylene glycol, 0.034 part of tetrabutyl titanate and 0.20 part of hydroquinone. They were heated with stirring at 200° C. for 40 minutes under atmospheric pressure, then for 30 minutes under an absolute pressure of 300 mmHg, then for 30 minutes under 20 mmHg and further for 50 minutes under 0.2 mmHg. During the reaction, the excess of triethylene glycol and the by-product butanol were distilled off out of the reaction system. The resulting reddish violet photosensitive polyester resin had a reduced viscosity of 0.45 dl/g. The elemental analysis values of the polyester resin were C67.05%, H5.08% and N6.35% which showed good correspondence with the calculated values C66.35%, H5.10% and N6.45%. Its infrared absorption spectrum showed characteristic absorptions of CN and the ester linkage at 2220 cm⁻¹ and 1718 cm⁻¹ respectively. Its nuclear magnetic resonance spectrum measured in CDCl₃ showed characteristic peaks based on —OCH₂CH₂—₃ at δ3.45–4.0 ppm and 4.23–4.65 ppm and characteristic peaks based on m-phenylene and

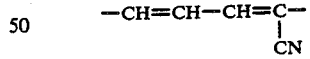

at δ6.9–8.3 ppm. Its visible absorption spectrum measured in chloroform showed a strong absorption at 260–460 nm ($\lambda_{max}$=355 nm).

The spectral sensitivity of the photosensitive polyester was measured by using a spectral irradiating apparatus in the same way as in Example 1. It was consequently found that it was sensitive to light having a wavelength of 390 to 510 nm. It had an absolute sensitivity (A) of 410 mJ/cm².

EXAMPLE 11

A reactor equipped with a stirrer was charged with 21.6 parts of p-phenylenebis(n-butyl α-cyanobutadienecarboxylate), 12.2 parts of diethyl azelate, 30.0 parts of triethylene glycol, 0.034 part of tetrabutyl titanate and 0.20 part of hydroquinone, and they were polymerized by the same method as in Example 1. The resulting reddish violet photosensitive polyester resin had a reduced viscosity of 0.79 dl/g. The polyester had elemental analysis values C63.75%, H6.82% and N3.42% which showed good correspondence with the calculated values C63.57%, H6.57% and N3.80%. Its infrared absorption spectrum showed characteristic absorptions based on CN and the ester linkage at 2220 cm$^{-1}$ and 1720 cm$^{-1}$ respectively.

A lithographic printing plate prepared from the resulting polyester by the same method as in Example 1 showed a sensitivity of 12 steps (A), and had an absolute sensitivity (A) of 23 mJ/cm$^2$.

EXAMPLES 12 TO 15

In each run, a photosensitive polyester resin was obtained by carrying out the same polymerization as in Example 1 except that a mixture of p-phenylenebis(n-butyl α-cyanobutadienecarboxylate) (to be referred to as compound A) with each of the various dicarboxylic acids shown in Table 2 was used instead of using the compound A alone.

The results are shown in Table 2.

TABLE 2

| Example | Dicarboxylic acid component Type | Parts | Reduced viscosity (dl/g) | Infrared absorption spectrum (cm$^{-1}$) |
|---|---|---|---|---|
| 12 | Compound A | 21.6 | 0.62 | νCN 2225 |
|  | Diethyl p-phenylenediacrylate | 13.7 |  | νCO 1720 1703 |
| 13 | Compound A | 32.4 | 0.99 | νCN 2225 |
|  | Diethyl azelate | 6.1 |  | νCO 1720 |
| 14 | Compound A | 21.6 | 0.83 | νCN 2225 |
|  | Dimethyl adipate | 8.7 |  | νCO 1720 |
| 15 | Compound A | 21.6 | 0.69 | νCN 2225 |
|  | Dimethyl 1,4-cyclohexane-dicarboxylate | 10.0 |  | νCO 1720 |

| Example |  | Elemental analysis values C (%) | H (%) | N (%) | Absolute sensitivity (A) mJ/cm$^2$ | Number of steps (A) |
|---|---|---|---|---|---|---|
| 12 | Calcd. | 65.78 | 5.52 | 3.65 | 290 | 5 |
|  | Found | 65.82 | 5.63 | 3.72 |  |  |
| 13 | Calcd. | 65.07 | 5.78 | 5.23 | 4 | 17 |
|  | Found | 65.36 | 5.98 | 5.12 |  |  |
| 14 | Calcd. | 62.24 | 6.10 | 4.03 | 15 | 13 |
|  | Found | 62.58 | 6.53 | 3.69 |  |  |
| 15 | Calcd. | 63.32 | 6.15 | 3.89 | 100 | 9 |
|  | Found | 63.56 | 6.43 | 3.58 |  |  |

EXAMPLE 16

A reactor equipped with a stirrer was charged with 43.2 parts of p-phenylenebis(di-n-butyl α-cyanobutadienecarboxylate), 30.0 parts of triethylene glycol, 0.051 part of tetrabutyl titanate and 0.20 part of hydroquinone, and they were polymerized by the same method as in Example 1. The resulting reddish violet photosensitive polyester resin was mixed with 2.9 parts of poly(ε-caprolactone) having a reduced viscosity of 0.65 dl/g. The mixture was heated with stirring at 200° C. for 20 minutes under atmospheric pressure to perform ester-interchange. The resulting photosensitive polyester resin had a reduced viscosity of 0.74 dl/g, and its infrared absorption spectrum showed characteristic absorptions of a polyester. A lithographic printing plate prepared from the resulting photosensitive polyester resin by the same method as in Example 1 had a sensitivity of 12 steps (A) upon exposure for 60 seconds, and an absolute sensitivity (A) of 20 mJ/cm$^2$.

EXAMPLE 17

A reactor equipped with a stirrer was charged with 43.2 parts of p-phenylenebis(n-butyl α-cyanobutadienecarboxylate), 30.0 parts of triethylene glycol, 0.55 part of lead acetate and 0.20 part of hydroquinone. They were heated with stirring at 200° C. for 40 minutes under atmospheric pressure, then for 30 minutes under an absolute pressure of 300 mmHg, then for 30 minutes under 20 mmHg and further for 30 minutes under 0.25 mmHg. Then, 43.4 parts of a polyester (reduced viscosity 0.68 dl/g) derived from an acid component composed of terephthalic acid and isophthalic acid (mole ratio 1:1) and a diol component composed of ethylene glycol and neopentylene glycol (mole ratio 1:1) was added, and the mixture was further heated with stirring at 200° C. under atmospheric pressure for 30 minutes to form a photosensitive polyester having a reduced viscosity of 0.89 dl/g. One hundred parts of the resulting photosensitive polyester was dissolved in 1,000 parts of methylene chloride to prepare a dope. The dope was coated on a grained aluminum plate by a bar coater (No. 20), and dried at 60° C. for 10 minutes to obtain a lithographic printing plate. The plate was exposed for 60 seconds to light from a 460 W metal halide lamp (light having a wavelength of less than 430 nm was cut off by a filter) through a Kodak photostep tablet, and then developed with methylene chloride. At this time, the image had 14 steps (A). The absolute sensitivity (A) was 13 mJ/cm$^2$.

EXAMPLE 18

Thirty parts of a photosensitive polyester polymer derived from p-phenylenebis(α-cyanobutadienecarboxylic acid) as an acid component and triethylene glycol as a diol component (having a reduced viscosity, measured at 30° C. in a mixed solvent composed of phenol and tetrachloroethane in a weight ratio of 40:60, of 0.80 dl/g; to be abbreviated resin [A-1]) and 70 parts of poly(vinyl α-cyanocynnamylideneacetate) (the degree of esterification 86%; to be abbreviated the resin [B-1]) were dissolved in 1,000 parts of methylene chloride to prepare a dope. The dope was coated on a grained aluminum plate by a bar coater (No. 20), and dried at 60° C. for 10 minutes to form a lithographic printing plate. The lithographic plate was exposed for 60 seconds to light from a 460 W metal halide lamp (light having a wavelength of less than 430 nm was cut off by a filter) through a Kodak step tablet, and then developed by the developing method (B).

The number of steps of the image at this time, defined as the number of steps (B), was 16.

The lithographic plate was exposed to an argon ion laser light (power 0.03 W, beam diameter 1.4 mm) for ½ to 1/500 seconds, and then developed by the developing method (B). The required energy was determined from the time which elapsed until the resulting spot diameter reached 1.4 mm, and was defined as the absolute sensitivity (B). As a result, the absolute sensitivity (B) was 5 mJ/cm$^2$.

The unexposed photosensitive plate used in this example did not show any change in sensitivity and the quality of the image in an acceleration test at 80° C. in a dark place in air for 1 week.

A lithographic printing plate was prepared by the same method as above by using the resin [A-1] alone instead of using the resins [A-1] and [B-1]. By the step tablet method, this plate was found to have 6 steps (B) and an absolute sensitivity (B) of 130 mJ/cm$^2$. The effect of using the resin [B-1] together was evident. This fact shows that the resin [B-1] does not function merely as a binder.

COMPARATIVE EXAMPLE 3

A lithographic printing plate was prepared by the same method as in Example 18 except that the resin [B-1] alone was used instead of using the resins [A-1] and [B-1]. By the step tablet method, this plate was found to have 0 step (B). It was substantially insensitive to visible light. Its absolute sensitivity (B) in laser exposure was more than 10$^5$ mJ/cm$^2$.

A lithographic printing plate was prepared by the same method as in Example 18 except that p-phenylenebis(n-butyl α-cyanobutadienecarboxylate), a compound having a similar photosensitive group, was used instead of the resin [A-1]. By the step tablet method, this plate was found to have zero step (B) and was substantially insensitive to visible light. Its absolute sensitivity (B) in laser exposure was more than 10$^5$ mJ/cm$^2$. This fact shows that although the resin [A-1] and the p-phenylenebis(n-butyl α-cyanobutadienecarboxylate) have a common photosensitive group, since the former is a polymer, it undergoes photocrosslinking reaction more effectively than the latter, and that neither of them acts as a mere sensitizer.

EXAMPLES 19 TO 22

Various lithographic printing plates were prepared in the same way as in Example 18 by varying the weight ratio of the resins [A-1] and resin [B-1]. It was found that all of these printing plates showed high sensitivity.

TABLE 3

| Example | Weight ratio of resin A-1 to resin B-1 | Number of steps (B) of the step tablet | Absolute sensitivity (B) (mJ/cm$^2$) |
|---|---|---|---|
| 19 | 10/90 | 14 | 7.5 |
| 20 | 20/80 | 15 | 6 |
| 21 | 50/50 | 13 | 9 |
| 22 | 70/30 | 12 | 14 |

EXAMPLE 23

A lithographic printing plate was prepared by coating 50 parts of the resin [A-1] used in Example 18 and 50 parts of a resin [B-2] (esterification degree 85%) obtained by converting the hydroxyl group of a phenoxy resin to an α-cyanocinnamylideneacetyl group on a grained aluminum plate. By the step tablet method, this plate was found to have 10 steps (B). Its absolute sensitivity (B) in argon laser exposure was 30 mJ/cm$^2$.

COMPARATIVE EXAMPLE 4

A lithographic printing plate was prepared in the same way in Example 23 except that the resin [B-2] alone was used instead of the resins [A-1] and [B-2] used in Example 23. By the step tablet method, this plate was found to have 0 step (B). Its absolute sensitivity (B) in argon laser exposure was more than 10$^5$ mJ/cm$^2$, and the plate was substantially insensitive to visible light.

EXAMPLE 24

A lithographic printing plate was prepared by coating 30 parts of the resin [A-1] and 70 parts of poly(vinyl cinnamate) (to be abbreviated as the resin [B-3]) (esterification degree 83%) on a grained aluminum plate in the same way as in Example 18. By the step tablet method, this plate was found to have 8 steps (B). Its absolute sensitivity in argon laser exposure was 70 mJ/cm$^2$.

COMPARATIVE EXAMPLE 5

A lithographic printing plate was prepared in the same way as in Example 24 except that the resin [B-3] alone was used instead of the resins [A-1] and [B-3] used in Example 24. By the step tablet method, the plate was found to have zero step (B). Its absolute sensitivity (B) in argon laser exposure was more than 10$^5$ mJ/cm$^2$, and the plate was substantially insensitive to visible light.

EXAMPLE 25

A lithographic printing plate was prepared by coating 50 parts of a photosensitive polyester polymer composed of m-phenylenebis(α-cyanobutadienecarboxylic acid) as an acid component and triethylene glycol as a diol component and having a reduced viscosity of 0.68 dl/g (to be abbreviated the resin [A-2]) and 50 parts of the resin [B-1] used in Example 18 on a grained aluminum plate. By the step tablet method, this plate was found to have 6 steps (B), and its absolute sensitivity (B) in argon laser exposure was 130 mJ/cm$^2$.

A lithographic printing plate was prepared in the same way as above except that the resin [A-2] alone was used instead of the resins [A-2] and [B-1]. By the step tablet method, this plate was found to have 3 steps (B), and its absolute sensitivity (B) in argon laser exposure was more than 700 mJ/cm$^2$.

The results show that the combination of the resins [A-2] and [B-1] evidently had a synergistic effect.

EXAMPLE 26

Fifty parts of the resin [A-1] was co-condensed with 50 parts of a copolymer of isophthalic acid, terephthalic acid, ethylene glycol and neopentylene glycol (mole ratio=1:1:1:1) to obtain a copolymer having a reduced viscosity of 0.70 dl/g (to be abbreviated resin [A-3]). By using 50 parts of the resin [A-3] and 50 parts of the resin [B-1], a lithographic printing plate was prepared in the same way as in Example 18. By the step tablet method, this plate was found to have 12 steps (B), and its absolute sensitivity (B) in argon laser exposure was more than 15 mJ/cm$^2$.

A lithographic printing plate was prepared in the same way as above except that the resin [A-3] alone was used instead of the resins [A-3] and the resin [B-1]. By the step tablet method, this plate was found to have 5 steps (B). Its absolute sensitivity (B) in argon laser exposure was more than 200 mJ/cm$^2$.

EXAMPLE 27

A lithographic printing plate was prepared in the same way as in Example 18 by using 30 parts of the resin [A-1], 30 parts of the resin [B-1] and 40 parts of the resin (P) as a binder. By the step tablet method, this plate was found to have 13 steps (B), and its absolute sensitivity (B) in argon laser exposure was 10 mJ/cm$^2$.

A lithographic printing plate was prepared in the same way as above except that 60 parts of the resin [A-1] alone was used instead of the resins [A-1] and [B-1]. By the step tablet method, this plate was found to have 6 steps (B), and its absolute sensitivity in argon laser exposure was 140 mJ/cm$^2$.

EXAMPLE 28

A lithographic printing plate was prepared in the same way as in Example 18 using a photosensitive polyester polymer derived from an acid component composed of 30 mole % of p-phenylenebis(α-cyanobutadienecarboxylic acid), 30 mole % of terephthalic acid and 40 mole % of isophthalic acid and triethylene glycol as a diol component and having a reduced viscosity of 0.56 dl/g, instead of the resin [A-1]. By the step tablet method, this plate was found to have 9 steps (B). Its absolute sensitivity (B) in argon laser exposure was 100 mJ/cm$^2$.

EXAMPLE 29

A lithographic printing plate was prepared in the same way as in Example 18 by using a photosensitive polyester polymer derived from an acid component composed of 50 mole % of p-phenylenebis(α-cyanobutadienecarboxylic acid) and 50 mole % of 1,4-cyclohexanedicarboxylic acid and triethylene glycol as a diol component and having a reduced viscosity of 0.61 dl/g instead of the resin [A-1]. By the step tablet method, this plate was found to have 14 steps (B). Its absolute sensitivity in argon laser exposure was 20 mJ/cm$^2$.

EXAMPLE 30

A lithographic printing plate was prepared in the same way as in Example 18 by using a photosensitive polyester polymer derived from an acid component composed of 50 mole % of p-phenylenebis(α-cyanobutadienecarboxylic acid) and 50 mole % of adipic acid and triethylene glycol as a diol component and having a reduced viscosity of 0.52 dl/g, instead of the resin [A-1]. By the step tablet method, this plate was found to have 15 steps (B). Its absolute sensitivity (B) in argon laser exposure was 10 mJ/cm$^2$.

EXAMPLE 31

Fifty parts of a photosensitive polyester polymer composed of m-phenylenebis(α-cyanobutadienecarboxylic acid) as an acid component and triethylene glycol as a diol component (reduced viscosity 0.45 dl/g), 50 parts of the resin (P), and 10 parts of 2, 6-di(4-methoxyphenyl)-4-(4-n-amyloxyphenyl)thiapyrylium perchlorate were dissolved in 1,000 parts of methylene chloride to prepare a dope. The dope was coated on a grained aluminum plate by a bar coater (No. 20), and dried at 60° C. for 10 minutes to form a lithographic printing plate. The printing plate was exposed for 60 seconds to light from a 460 W metal halide lamp (light having a wavelength of less than 430 nm was cut off) through a Kodak step tablet, and then developed with methylene chloride. The image had 10 steps (A). The coated aluminum plate was exposed to light from a 500 W xenon arc lamp for 30 minutes by using a spectral irradiating apparatus. It was sensitive to light having a wavelength in the range of 405 to 565 nm.

EXAMPLE 32

A lithographic printing plate was prepared in the same way as in Example 31 except that 10 parts of Rose Bengale was used instead of 2,6-di(4-methoxyphenyl)-4-(4-n-amyloxyphenyl)thiapyrylium perchlorate. The number of steps (A) of the image determined by a Kodak step tablet was 10.

EXAMPLES 33 TO 36

In each run, a lithographic printing plate was prepared in the same way as in Example 1 using each of the various polymers shown in Table 4. The plate was exposed for 60 seconds to light from a 460 W metal halide lamp (light having a wavelength of less than 430 nm was cut off by a filter) through a step tablet. The results are summarized in Table 4.

TABLE 4

| Example | Polyester polymer Acid component (mole %) | Polyester polymer Diol component (mole %) | Reduced viscosity (dl/g) | Parts | Binder Type | Parts | Sensitivity (A) (the number of steps) | Absolute sensitivity (A) (mJ/cm$^2$) |
|---|---|---|---|---|---|---|---|---|
| 33 | Compound A (50) p-Phenylenediacrylic acid (50) | Triethylene glycol (50) and 1,4-di(β-hydroxyethoxy)-cyclohexane (50) | 0.62 | 50 | Polyester resin (P) | 50 | 10 | 45 |
| 34 | Compound A (50) Sebacic acid (20) | Triethylene glycol (80) and 1,4-cyclohexanediol (20) | 0.91 | 50 | Polyester resin (P) | 50 | 13 | 10 |
| 35 | Compound A (100) | Triethylene glycol (100) | 0.75 | 50 | Poly(methyl methacrylate) | 50 | 13 | 9 |
| 36 | Compound A (100) | Triethylene glycol (100) | 0.75 | 50 | Polycarbonate | 50 | 13 | 9 |

What we claim is:

1. A substantially linear polyester polymer having sensitivity to visible light, said polymer containing at least 10 mole%, based on the entire polymer, of recurring units of the following formula

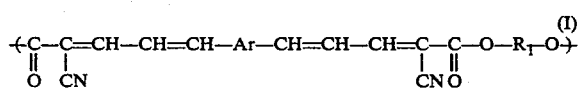
(I)

wherein Ar represents

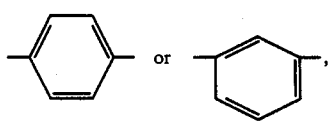

and R$_1$ represents a divalent aliphatic hydrocarbon group having not more than 20 carbon atoms, the chain of which may be interrupted by one or more oxygen atoms, and having a reduced viscosity of at least 0.2 dl/g.

2. The polymer of claim 1 which contains 20 to 100 mole% of the recurring units of formula (I).

3. The polymer of claim 1 which has a reduced viscosity of at least 0.3 dl/g.

4. The polymer of claim 1 wherein Ar is

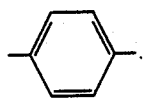

5. The polymer of claim 1 wherein $R_1$ represents a divalent aliphatic hydrocarbon group having 2 to 12 carbon atoms, the chain of which may be interrupted by 1 to 5 oxygen atoms.

6. The polymer of claim 1 wherein $R_1$ represents $-(CH_2CH_2O)_{\overline{m-1}}CH_2CH_2-$ in which m is an integer of 2 to 4, an alkylene group having 2 to 8 carbon atoms,

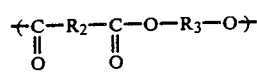

7. The polymer of claim 1 which further contains 0 to 90 mole%, based on the entire polymer, of recurring units of the following formula

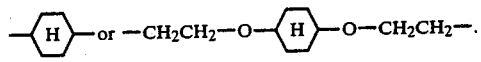

and/or

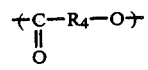

wherein $R_2$ represents a divalent hydrocarbon group having not more than 15 carbon atoms, $R_3$ represents a divalent aliphatic hydrocarbon group having not more than 20 carbon atoms, the chain of which may be interrupted by one or more oxygen atoms, and $R_4$ represents a divalent hydrocarbon group having 4 to 9 carbon atoms.

8. The polymer of claim 7 wherein $R_2$ represents an alkylene group having 1 to 10 carbon atoms, $-CH=CH-$,

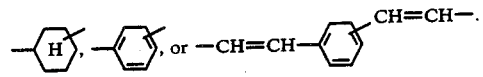

9. The polymer of claim 7 wherein $R_3$ represents a divalent aliphatic hydrocarbon group having 2 to 12 carbon atoms, the chain of which may be interrupted by 1 to 5 oxygen atoms.

10. The polymer of claim 7 wherein $R_3$ is $-(CH_2CH_2O)_{\overline{m-1}}CH_2CH_2-$ in which m is an integer of 2 to 4, an alkylene group having 2 to 8 carbon atoms,

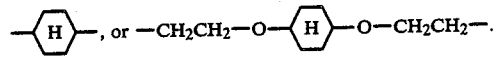

11. The polymer of claim 7 wherein $R_4$ is $-CH_2-_5$,

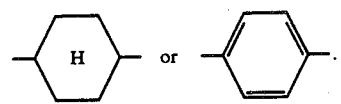

12. The polymer of claim 1 which is sensitive to light having a wavelength of at least about 488 nm and/or about 515 nm.

13. A visible light-sensitive resin composition comprising the substantially linear polyester polymer having sensitivity to visible light according to claim 1.

* * * * *